US007477097B2

(12) United States Patent
Choi et al.

(10) Patent No.: US 7,477,097 B2
(45) Date of Patent: Jan. 13, 2009

(54) INTERNAL VOLTAGE GENERATING CIRCUIT

(75) Inventors: Jun-Gi Choi, Kyoungki-do (KR); Seung-Min Oh, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 141 days.

(21) Appl. No.: 11/529,254

(22) Filed: Sep. 29, 2006

(65) Prior Publication Data

US 2007/0069805 A1 Mar. 29, 2007

(30) Foreign Application Priority Data

Sep. 29, 2005 (KR) ...................... 10-2005-0090967
Mar. 31, 2006 (KR) ...................... 10-2006-0029647

(51) Int. Cl.
*G05F 1/575* (2006.01)
*H03K 3/356* (2006.01)

(52) U.S. Cl. ........................ 327/543; 327/175; 327/541

(58) Field of Classification Search ....................... None
See application file for complete search history.

(56) References Cited

U.S. PATENT DOCUMENTS

| | | | | | |
|---|---|---|---|---|---|
| 5,315,557 | A * | 5/1994 | Kim et al. | ................... | 365/222 |
| 5,847,596 | A | 12/1998 | Ryu | | |
| 5,889,719 | A * | 3/1999 | Yoo et al. | ................... | 365/226 |
| 5,920,226 | A * | 7/1999 | Mimura | ...................... | 327/537 |
| 6,194,887 | B1 | 2/2001 | Tsukada | | |
| 6,522,193 | B2 | 2/2003 | Shin | | |
| 7,166,993 | B2 * | 1/2007 | Shimizu et al. | ............. | 323/282 |
| 7,362,164 | B2 * | 4/2008 | Kang | ......................... | 327/536 |
| 2004/0155701 | A1 | 8/2004 | Kim et al. | | |

FOREIGN PATENT DOCUMENTS

| | | |
|---|---|---|
| KR | 94-16235 | 7/1994 |
| KR | 10-1996-0000837 B1 | 1/1996 |
| KR | 10-2004-0046660 | 6/2004 |

OTHER PUBLICATIONS

Korean Office Action issued in corresponding Korean Patent Application No. KR 10-2006-0029647, dated Feb. 26, 2007.

* cited by examiner

*Primary Examiner*—Lincoln Donovan
*Assistant Examiner*—Terry L Englund
(74) *Attorney, Agent, or Firm*—McDermott Will & Emery LLP

(57) ABSTRACT

An internal voltage generating circuit detects a level of a back bias voltage or a pumping voltage and controls a period of an oscillating signal based on the result of counting timing when the detected voltage is lower than a reference voltage. The internal voltage generating circuit includes a back bias/pumping voltage detector for detecting a level difference between a back bias/pumping voltage and a reference voltage, a period controller for controlling a period of an oscillating signal based on the detection result of the back bias/pumping voltage detector, and a pumping unit for pumping the back bias/pumping voltage according to an activation period of the oscillating signal.

44 Claims, 9 Drawing Sheets

THE COUPLING IS INCREASED BY PUMPING VOLTAGE VPP

COUPLING THROUGH THE PUMPING VOLTAGE VPP IS DECREASED

CONSUMPTION OF PUMPING CURRENTS IPP IS INCREASED

CONSUMPTION OF PUMPING CURRENTS IPP IS DECREASED

INTERNAL VOLTAGE GENERATING CIRCUIT

FIELD OF THE INVENTION

The present invention relates to an internal voltage generating circuit; and, more particularly, to a semiconductor device for generating a stable internal voltage in response to fluctuations of a back bias voltage or a pumping voltage, and controlling a period of output pulse generated from an oscillator based on a value of counting fluctuations of the back bias voltage or the pumping voltage.

DESCRIPTION OF RELATED ARTS

Generally, a semiconductor memory device requires not only a power voltage supplied from external circuits but also internal voltages generated from an internal circuit, having various levels. The internal voltages generated from external voltage are used for internal operations of the semiconductor memory device. There are two methods for generating an internal voltage from the power voltage. A first method is a down converting method to pull down the power voltage to generate the internal voltage having a lower level than the external voltage. A second method is generating an internal voltage having a higher level than the power voltage or a lower level than a ground voltage by using a charge pump.

For decreasing power consumption, the semiconductor memory device uses the internal voltage generated by down converting. The internal voltage generated from the charge pump is used for performing a particular operation, described as follows.

Among the internal voltages generated from the charge pump, a pumping voltage VPP and a back bias voltage VBB are generally used in a DRAM. The pumping voltage VPP is induced to a gate of a cell transistor or a word line. Because the pumping voltage is higher than an external supply voltage VCC, the pumping voltage VPP prevents cell data from loss. Further, for preventing cell data from loss, the back bias voltage VBB lower than a ground voltage VSS is induced in a bulk of the cell transistor.

The internal voltage generating circuits are provided with a detecting circuit for detecting levels and a pumping circuit for increasing or decreasing voltages through a charge pumping method. Efficiency of the charge pump has an effect on generating the pumping voltage VPP and the back bias voltage VBB. Accordingly, embodying a charge pump having higher efficiency in a smaller or an identical area is an important subject.

As the external voltage decreases lower than 1.5 voltage level, the internal voltage generated from down converting for decreasing power consumption impedes circuit operation.

A gate of a bit line equalizing transistor can be described as an example. When the external supply voltage or lower level of the voltage is used as a pull-up voltage in order to control the gate of the bit line equalizing transistor, which is for equalizing a bit line BL and a bit line bar /BL in a bit line sense amplifier BLSA, the bit line BL and the bit line bar /BL are not properly equalized.

In operation of the bit line sense amplifier BLSA, when the external supply voltage or lower level of the voltage is used as a pull-up voltage in order to control a transistor which is for precharging a pull-up transistor RT0 and a pull-down transistor SB as a level of a bit line precharge voltage VBLP, precharge operation is not performed properly.

In addition, when the external supply voltage or lower level of the voltage is used as a pull-up voltage in order to control a gate of a transistor which is for precharging between signal and local I/O lines and between the local I/O and global I/O lines, precharge operation is not performed properly.

The characteristic of a NMOS transistor imposes difficulty in transmitting at a high level. When a gate voltage is not higher than a drain voltage by a threshold voltage and a source voltage is applied to a drain, the drain voltage is less than the source voltage level by the threshold voltage.

FIG. 1 is a circuit diagram of a conventional back bias voltage generating circuit.

The conventional back bias voltage generating circuit is provided with a back bias voltage detector 1 and an oscillator 2.

The back bias voltage detector 1 includes PMOS transistors P1 and P2 and inverters IV1 and IV2. The first and the second PMOS transistors P1 and P2, connected in series between a core voltage VCORE node and a ground voltage VSS node, receive the ground voltage VSS or the back bias voltage VBB from each gate. The first and the second inverters IV1 and IV2 delay a signal on a node AA and output a detecting signal DET.

The oscillator 2 includes a NAND gate ND1 and plural inverters IV3 to IV8 connected in series. The NAND gate ND1 performs a logic NAND operation to the detecting signal DET and output of the inverter IV8, outputting a oscillating signal OSC_OUT. The plural inverters IV3 to IV8 delay the output of the NAND gate ND1 and output to the NAND gate ND1.

The conventional back bias voltage generating circuit functions to compare a level of the back bias voltage VBB with a level of the ground voltage VSS. When the back bias voltage VBB is higher than a threshold voltage of the PMOS transistor P2, that is, an absolute value of the back bias voltage VBB is small, currents flowing through the PMOS transistor P2 are decreased.

Accordingly, voltage on the node AA becomes a high level and the detecting signal DET also becomes a high level. Thereafter, the oscillator 2 is operated by the detecting signal DET and pumping operation is performed. Consequently the level of the back bias voltage is decreased.

Comparing a level of the back bias voltage VBB with a level of the ground voltage VSS, the PMOS transistor P2 turns on if the back bias voltage VBB is lower than threshold voltage of the PMOS transistor P2, that is, an absolute value of the back bias voltage VBB is high.

Accordingly, the voltage on node AA and the detecting signal DET become low levels. The operation of the oscillator 2 and pumping operation cease.

FIG. 2 is a circuit diagram of a pumping voltage generating circuit in accordance with another conventional embodiment.

The conventional pumping voltage generating circuit includes a pumping voltage detector 3 and an oscillator 4.

The pumping voltage detector 3 includes resistors R1 and R2, PMOS transistors P3 and P4, NMOS transistors N1 to N3 and an inverter IV9. The first and the second resistors R1 and R2 are connected in series between a pumping voltage VPP node and a ground voltage VSS node. The first and the second PMOS transistor P3 and P4 and the first and the second NMOS transistor N1 to N3 form a comparator, which compares a voltage on a node BB with a reference voltage VREFP when the supply voltage VDD is applied and the third NMOS transistor N3 turns on. The inverter IV9 inverts output of the comparator and outputs a detecting signal DET.

The oscillator 4 includes a NAND gate ND2 and plural inverters IV10 to IV15 connected in series. The NAND gate ND2 performs a logic NAND operation to the detecting signal DET and output of the inverter IV15 and outputs an oscillating signal OSC_OUT. The plural inverters IV10 to IV15 delay the output of the NAND gate ND2 and output to the NAND gate ND2.

The conventional pumping voltage generating circuit functions to compare the pumping voltage VPP divided by the first and the second resistors R1 and R2 with the reference voltage VREFP. When the resistor-divided pumping voltage is lower than the reference voltage VREFP, currents flowing through the first NMOS transistor N1 are decreased. A voltage on a node CC is increased and the second PMOS transistor P4 turns off. The detecting signal DET becomes a high level and the oscillator 4 is operated. Thereafter, pumping operation is performed and the pumping voltage VPP is increased.

Comparing the resistor-divided pumping voltage with the reference voltage VREFP, the detecting signal DET becomes a low level if the resistor-divided pumping voltage is higher than the reference voltage VREFP. Consequently the operation of the oscillator 4 and the pumping operation cease.

In the conventional back bias voltage generating circuit and pumping voltage generating circuit, the oscillator is used for pumping operation to generate the back bias voltage VBB or the pumping voltage VPP as described above. Accordingly, pumping speed is determined according to a period of the oscillating signal OSC_OUT generated from the oscillator.

Because the period of the oscillating signal OSC_OUT is constant, the pumping speed is determined as constant without reference to requirement for the pumping operation. That is, because the period is fixed in the oscillator, the pumping speed can not be changed according to fluctuation speed of the back bias voltage VBB.

Such operation raises serious consideration in regard to a circuit having a negative word line method. When the coupling is generated according to fluctuation of the pumping voltage VPP, it is difficult to maintain a stable back bias voltage VBB.

Because the constant period of the oscillator is used in the period of less consumption for the pumping voltage VPP, excessive IDD currents are consumed. Accordingly current consumption is increased in the circuit and it is difficult to maintain a stable pumping voltage.

SUMMARY OF THE INVENTION

It is, therefore, an object of the present invention to provide an internal voltage generating circuit for detecting a level of a back bias voltage or a pumping voltage and for controlling a period of an oscillating signal based on the result of counting timing when the detected voltage is lower than a reference voltage.

In accordance with an aspect of the present invention, there is provided an internal voltage generating circuit, including a back bias voltage detector for detecting a level difference between a back bias voltage and a reference voltage, a period controller for controlling a period of an oscillating signal based on the detection result of the back bias voltage detector, and a pumping unit for pumping the back bias voltage according to an activation period of the oscillating signal.

In accordance with an another aspect of the present invention, there is provided an internal voltage generating circuit, including a pumping voltage detector for detecting a level difference between a pumping voltage and a reference voltage, a period controller for counting timing when the pumping voltage is lower than the reference voltage to generate an oscillating signal having a period determined by the counted value, and a pumping unit for pumping the pumping voltage according to an activation period of the oscillating signal.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Hereinafter, a semiconductor memory device in accordance with the present invention will be described in detail referring to the accompanying drawings.

Figure 1:
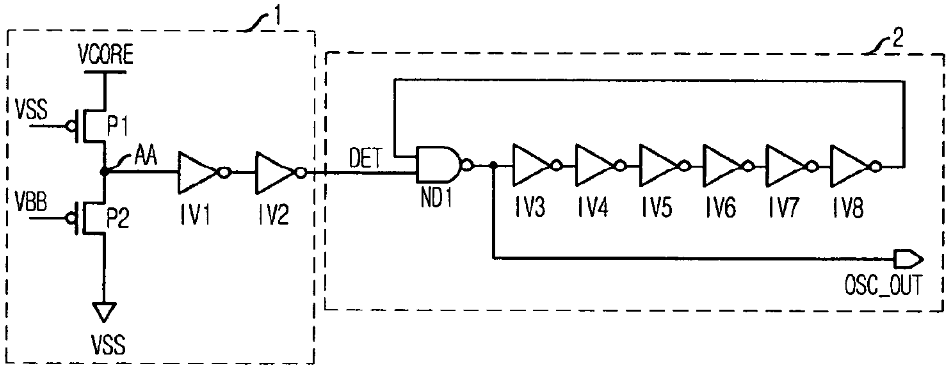
FIG. 1 (RELATED ART)
FIG. 1 is a circuit diagram of a conventional back bias voltage generating circuit.
Figure 2:
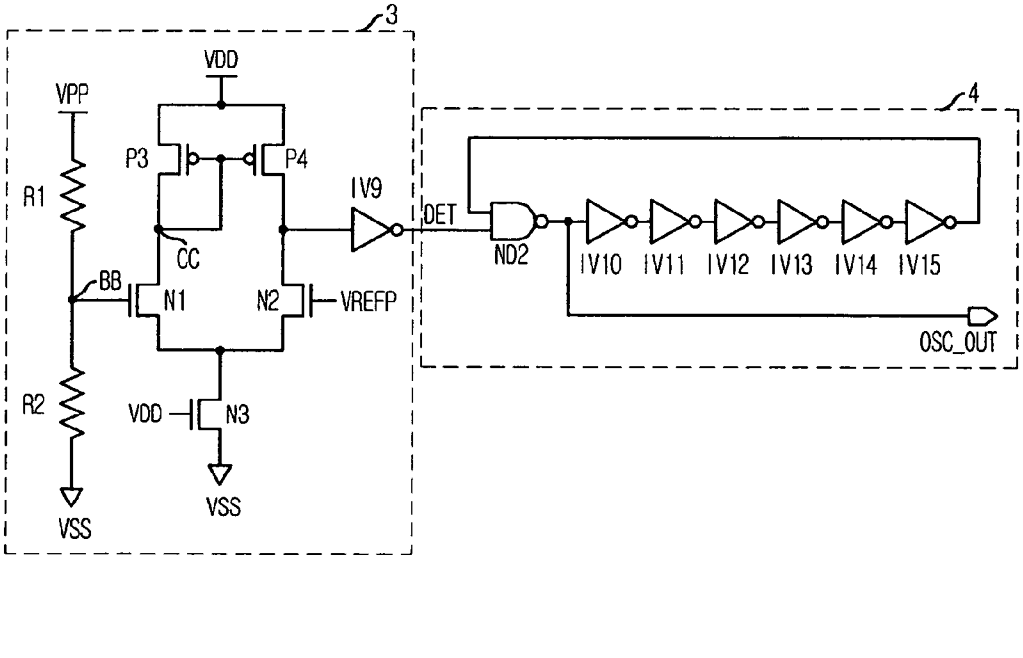
FIG. 2 (RELATED ART)
FIG. 2 is a circuit diagram of a conventional pumping voltage generating circuit.
Figure 3:
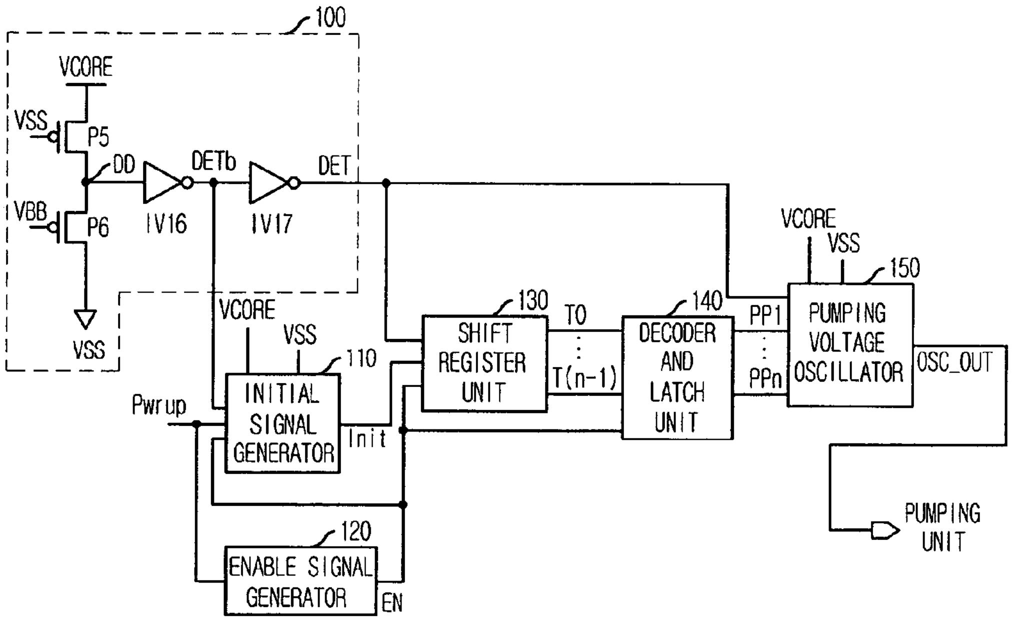
FIG. 3 is a block diagram of an internal voltage generating circuit in accordance with the present invention.

FIG. 3 is a block diagram of an internal voltage generating circuit in accordance with the present invention.

The internal voltage generating circuit includes a back bias voltage detector 100, an initial signal generator 110, an enable signal generator 120, a shift register unit 130, a decoder and latch unit 140 and a pumping voltage oscillator 150.

The back bias voltage detector 100 includes PMOS transistors P5 and P6 and inverters IV16 and IV17. The first and second PMOS transistors P5 and P6, connected in series between a core voltage VCORE node and a ground voltage VSS node, receive the ground voltage VSS or the back bias voltage VBB from each gate. The first inverter IV16 inverts a signal on a node DD and outputs an inverse detecting signal DETb. The second inverter IV17 inverts the inverse detecting signal DETb and outputs a detecting signal DET.

The initial signal generator 110 receives the inverse detecting signal DETb, a power-up signal Pwrup and an enable signal EN, outputting an initial signal Init. And the enable signal generator 120 outputs the enable signal EN in response to the power-up signal Pwrup. The shift register unit 130 receives the detecting signal DET, the initial signal Init and the enable signal EN, outputting plural count signals T0 to T(n−1).

Accordingly the decoder and latch unit 140 decodes and latches the plural count signals T0 to T(n−1) in response to the enable signal EN, outputting plural pumping control signals PP1 to PPn. The pumping voltage oscillator 150 receives the detecting signal DET and the plural pumping control signal PP1 to PPn, outputting an oscillating signal OSC_OUT.

Figure 4:
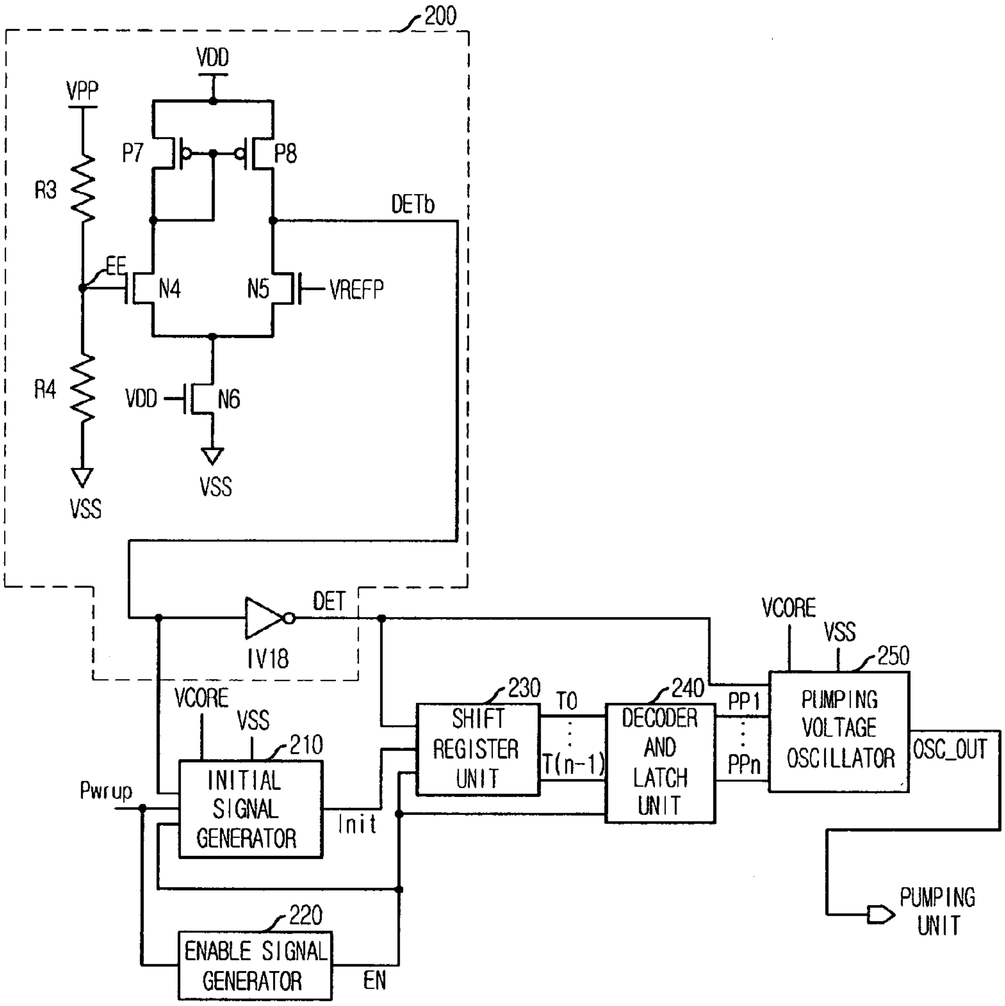
FIG. 4 is a block diagram of an internal voltage generating circuit in accordance with another embodiment of the present invention.

FIG. 4 is a block diagram of an internal voltage generating circuit in accordance with another embodiment of the present invention.

The internal voltage generating circuit includes a pumping voltage detector 200, an initial signal generator 210, an enable signal generator 220, a shift register unit 230, a decoder and latch unit 240, and a pumping voltage oscillator 250.

The pumping voltage detector 200 includes resistors R3 and R4, PMOS transistors P7 and P8, NMOS transistors N4 to N6 and an inverter IV18. The first and second resistors R3 and R4 are connected in series between a pumping voltage VPP node and a ground voltage VSS node. The first to the third PMOS transistors P7 and P8 and the first and the second NMOS transistors N4 to N6 form a comparator, which compares a voltage on a node EE with reference voltage VREFP when the supply voltage VDD is induced and the third NMOS transistor N6 turns on. The comparator outputs an inverse detecting signal DETb. The inverter IV18 inverts the inverse detecting signal DETb and outputs a detecting signal DET.

The initial signal generator 210 receives the inverse detecting signal DETb, a power-up signal Pwrup and an enable signal EN, outputting an initial signal Init. The enable signal generator 220 outputs the enable signal EN in response to the power-up signal Pwrup. The shift register unit 230 receives the detecting signal DET, the initial signal Init and the enable signal EN, outputting plural count signals T0 to T(n−1).

Accordingly, the decoder and latch unit 240 decodes and latches the plural count signals T0 to T(n−1) in response to the enable signal EN, outputting plural pumping control signals PP1 to PPn. The pumping voltage oscillator 250 receives the detecting signal DET and the plural pumping control signal PP1 to PPn, outputting an oscillating signal OSC_OUT.

Figure 5:
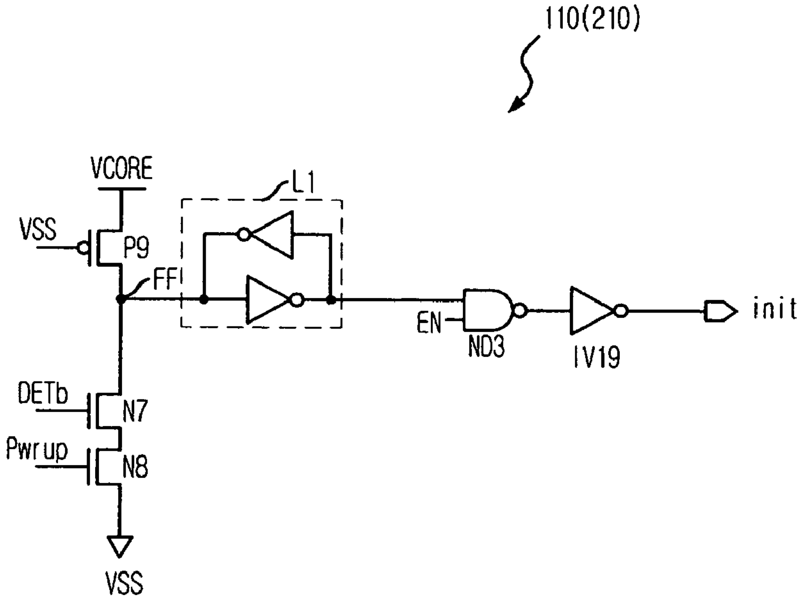
FIG. 5 is a circuit diagram of an initial signal generator shown in FIGS. 3 and 4.

FIG. 5 is a circuit diagram of the initial signal generator shown in FIGS. 3 and 4.

The initial signal generators 110 and 210 have the same configuration and, accordingly, the initial signal generator 110 is described by example.

The initial signal generator 110 includes a PMOS transistor P9, NMOS transistors N7 and N8, a latch L1, a NAND gate ND3 and an inverter IV19.

The PMOS transistor P9 and the first and the second NMOS transistors N7 and N8 are connected in series between the core voltage VCORE and the ground voltage VSS. The PMOS transistor P9 receives the ground voltage VSS through the gate. The first and the second NMOS transistors N7 and N8 receive the inverse detecting signal DETb or the power-up signal Pwrup through each gate. The latch L1 latches a signal in a node FF for predetermined time. The NAND gate ND3 performs a logic NAND operation to an output of the latch L1 and the enable signal EN. The inverter IV19 inverts an output of the NAND gate ND3 and outputs the initial signal Init.

Figure 6:
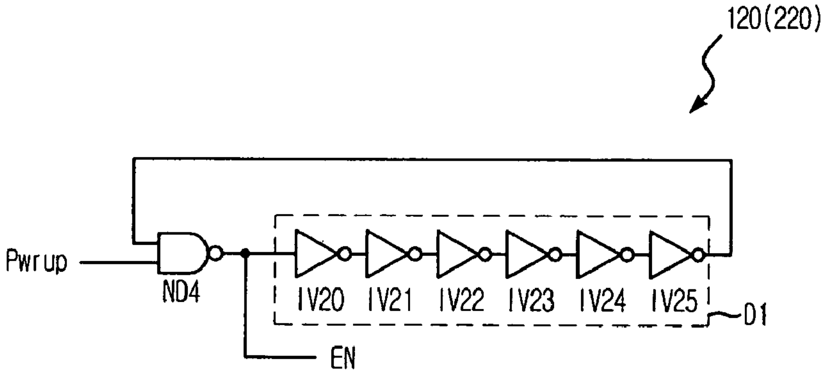
FIG. 6 is a circuit diagram of an enable signal generator shown in FIGS. 3 and 4.

FIG. 6 is a circuit diagram of the enable signal generator shown in FIGS. 3 and 4.

The enable signal generators 120 and 220 have the same configuration and, accordingly, the enable signal generator 120 is described by example.

The enable signal generator 120 includes a NAND gate ND4 and a delay unit D1. The delay unit D1 is provided with plural inverters IV20 to IV25 connected in series. The NAND gate ND4 performs a logic NAND operation to the power-up signal Pwrup and an output of the delay unit D1, outputting the enable signal EN. The delay unit D1 delays the enable signal EN for predetermined delay time and outputs to the NAND gate ND4.

Figure 7:
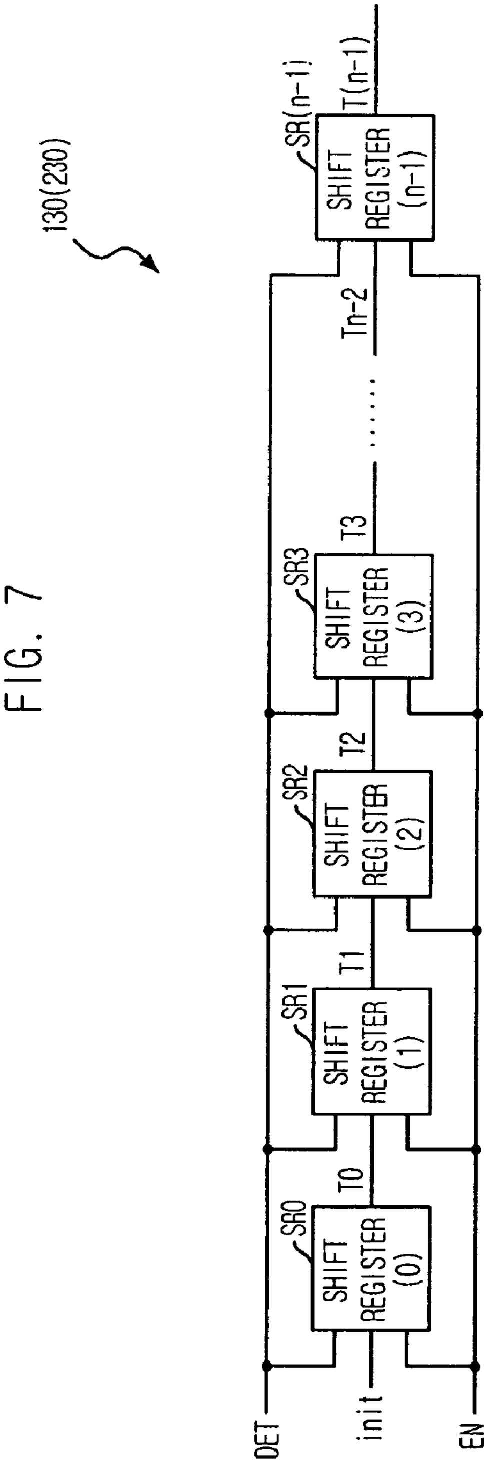
FIG. 7 is a block diagram of a shift register unit shown in FIGS. 3 and 4.

FIG. 7 is a block diagram of the shift register unit shown in FIGS. 3 and 4.

The shift register units 130 and 230 have the same configuration and, accordingly, the shift register unit 130 is described by example.

The shift register unit 130 includes plural shift registers SR0 to SR(n−1). The plural shift registers SR0 to SR(n−1), connected in series, receive the detecting signal DET and the enable signal EN. The plural shift registers SR0 to SR(n−1) count the initial signal Init in order and output the plural count signals T0 to T(n−1).

Figure 8:
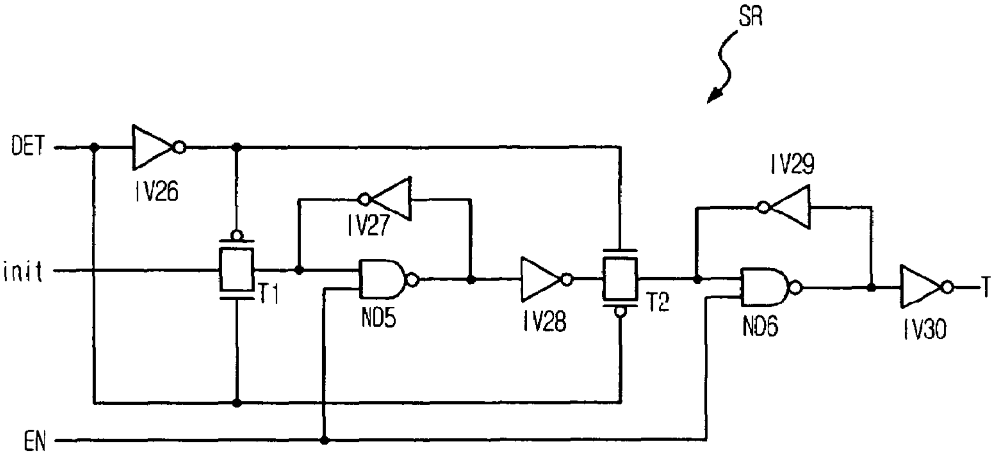
FIG. 8 is a circuit diagram of a shift register shown FIG. 7.

FIG. 8 is a circuit diagram of the shift register described shown FIG. 7.

The shift register SR includes inverters IV26 to IV30, transmission gates T1 and T2 and NAND gates ND5 and ND6.

The inverter IV26 inverts the detecting signal DET. The first transmission gate T1 selectively outputs the initial signal Init according to conditions of the detecting signal DET and an output of the inverter IV26. A first NAND latch, including the NAND gate ND5 and the inverter IV27, latches an output of the first transmission gate T1 in response to the enable signal EN. The inverter IV28 inverts an output of the NAND gate ND5.

The second transmission gate T2 selectively outputs an output of the inverter IV28 according to conditions of the detecting signal DET and the output of the inverter IV26. A second NAND latch, including the NAND gate ND6 and the inverter IV29, latches an output of the second transmission gate T2 in response to the enable signal EN. The inverter IV30 inverts an output of the NAND gate ND6 and outputs the count signal T.

Figure 9:
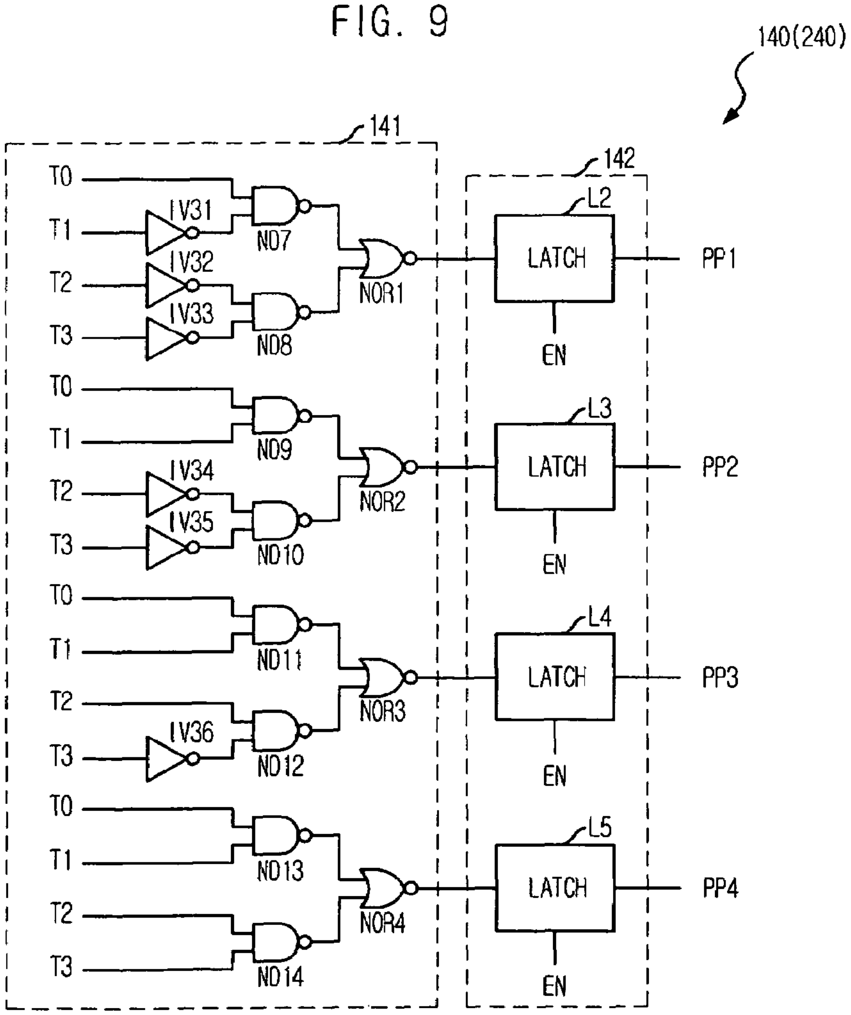
FIG. 9 is a block diagram of a decoder and latch unit shown in FIGS. 3 and 4.

FIG. 9 is a block diagram of a decoder and latch unit shown in FIGS. 3 and 4;

The decoder and latch units 140 and 240 have the same configuration. Accordingly, the decoder and latch unit 140 is described by example, particularly when n is integer representing the number of 3.

The decoder and latch unit 140 includes a decoder 141 and a latch unit 142. The decoder includes plural inverters IV31 to IV36, plural NAND gates ND7 to ND14 and NOR gates NOR1 to NOR4.

The NAND gate ND7 performs a logic NAND operation to the count signal T0 and the count signal T1 inverted by the inverter IV31. The NAND gate ND8 performs a logic NAND operation to the count signal T2 inverted by the inverter IV32 and the count signal T3 inverted by the inverter IV33. The NAND gate ND9 performs a logic NAND operation to the count signals T0 and T1. The NAND gate ND10 performs a logic NAND operation to the count signal T2 inverted by the inverter IV34 and the count signal T3 inverted by the inverter IV35.

The NAND gate ND11 performs a logic NAND operation to the count signal T0 and T1. The NAND gate ND12 performs a logic NAND operation to the count signal T2 and the count signal T3 inverted by the inverter IV36. The NAND gate ND13 performs a logic NAND operation to the count signal T0 and T1. The NAND gate ND14 performs a logic NAND operation to the count signals T2 and T3.

The first NOR gate NOR1 performs a logic NOR operation to outputs of the NAND gates ND7 and ND8. The second NOR gate NOR2 performs a logic NOR operation to outputs of the NAND gates ND9 and ND10. The third NOR gate NOR3 performs a logic NOR operation to outputs of the NAND gates ND11 and ND12. The fourth NOR gate NOR4 performs a logic NOR operation to outputs of the NAND gates ND13 and ND14.

The latch unit 142 includes plural latches L2 to L5. The plural latches L2 to L5 are NAND latches. The latch latches output of each of the corresponding NOR gates in response to the enable signal EN, outputting the plural pumping control signals PP1 to PPn.

Figure 10:
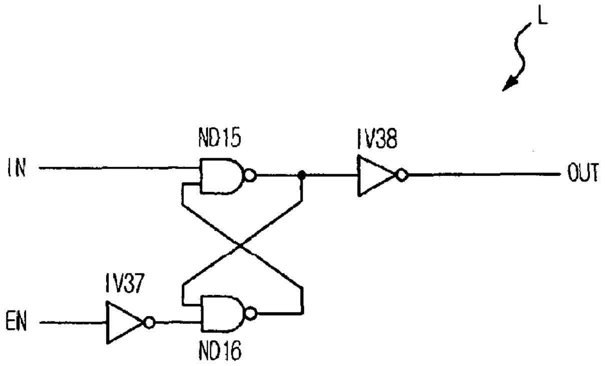
FIG. 10 is a circuit diagram of a latch shown in FIG. 9.

FIG. 10 is a circuit diagram of a latch shown in FIG. 9.

The latch L includes inverters IV37 and IV38 and NAND gates ND15 and ND16. The inverter IV37 inverts the enable signal EN. The NAND gate ND15 performs a logic NAND operation to an input signal IN and an output of the NAND gate ND16. The NAND gate ND16 performs a logic NAND operation to outputs of the NAND gate ND15 and the inverter IV37. The second inverter IV38 inverts the output of the NAND gate ND15 and outputs an output signal OUT.

Figure 11:
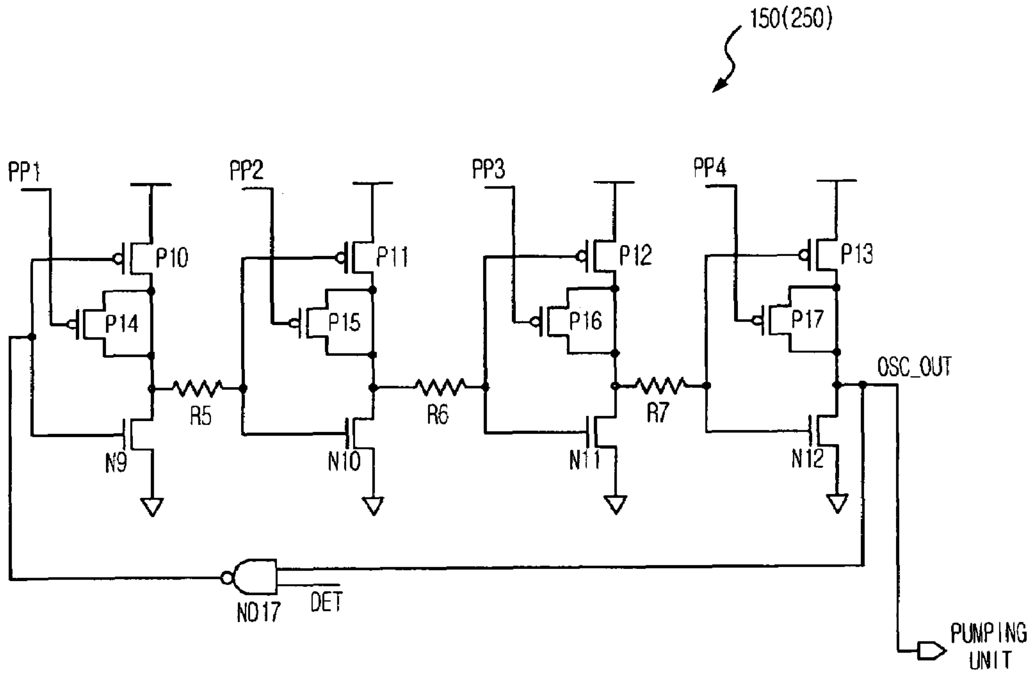
FIG. 11 is a circuit diagram of a pumping voltage oscillator shown in FIGS. 3 and 4.

FIG. 11 is a circuit diagram of a pumping voltage oscillator shown in FIGS. 3 and 4.

The pumping voltage oscillators 150 and 250 have the same configuration and, accordingly, the pumping voltage oscillator 150 is described by example.

The pumping voltage oscillator 150 includes plural PMOS transistors P10 to P17, plural NMOS transistor N9 to N12, resistors R5 to R7 and a NAND gate ND17.

The NAND gate ND17 performs a logic NAND operation to the detecting signal DET and the oscillating signal OSC_OUT. The PMOS transistors P14 to P17 receive the plural pumping control signals PP1 to PPn through each gate. The plural PMOS transistors P10 to P13 and the plural corresponding NMOS transistors N9 to N12 are connected in series between the core voltage VCORE node and the ground voltage VSS node and have gates connected to corresponding resistors R5 to R7. However, the PMOS transistor P10 and the NMOS transistor N9 receive output of the NAND gate ND17 through coupled gates. The PMOS transistor P13 and the NMOS transistor N12 output the oscillating signal OSC_OUT through a coupled drain.

Figure 12:
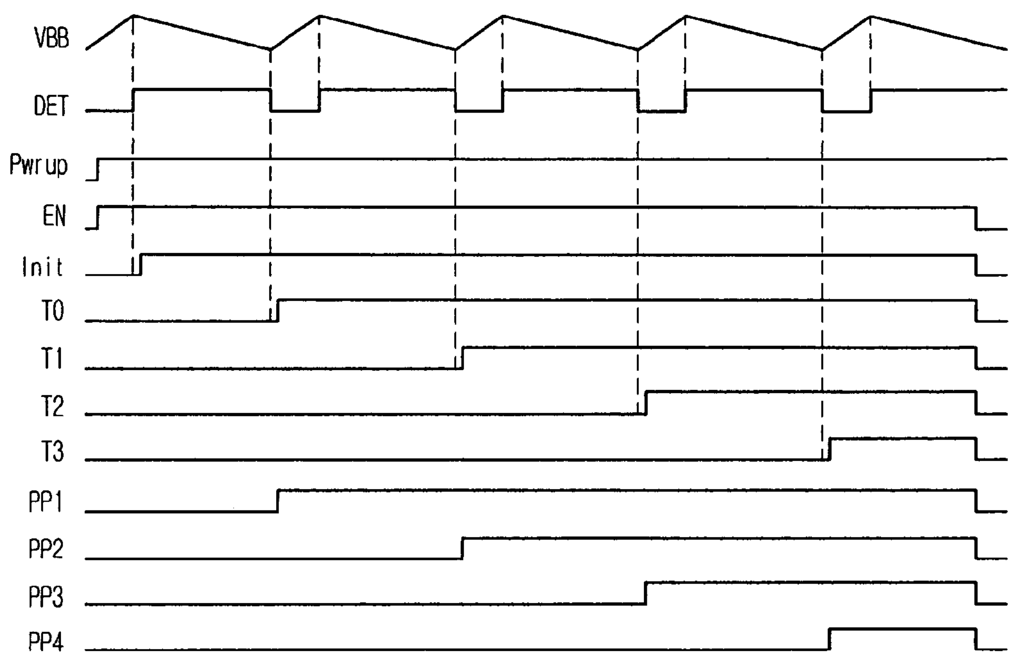
FIGS. 12 to 15 are waveform diagrams for explaining operation of the internal voltage generating circuit in accordance with the present invention.
Figure 13:
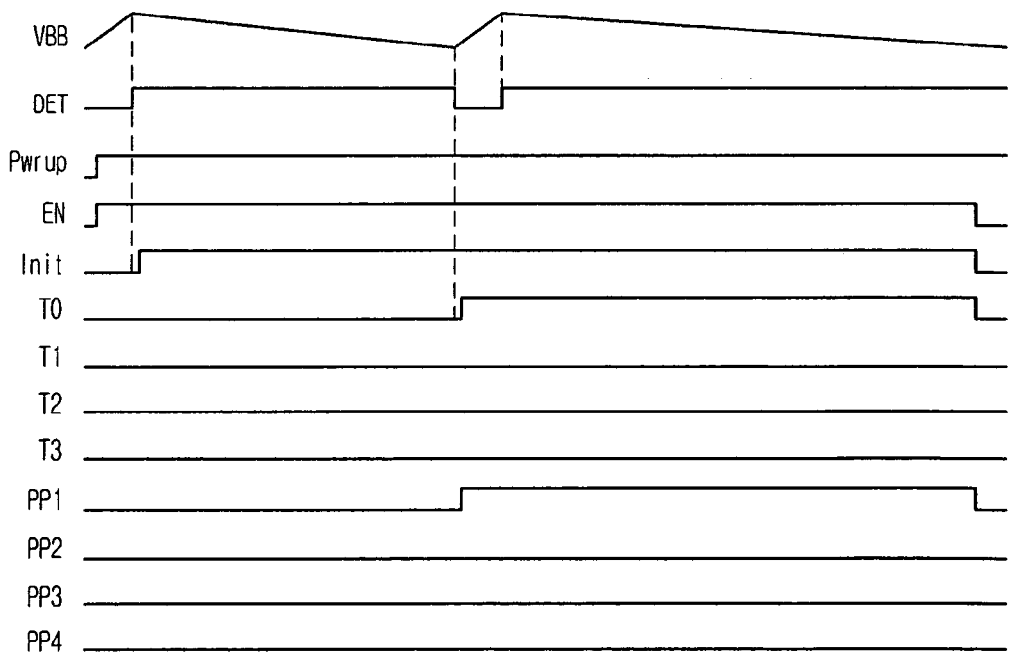

Referring to FIGS. 12 and 13, operation is explained below.

When the power-up signal Pwrup is activated in initial operation, the NMOS transistor N8 of the initial signal generators 110 and 210 turns on. The inverse detecting signal DETb becomes a high level if there is no need for performing pumping operation. Accordingly, the NMOS transistor N7 also turns on and a high level signal is output through the latch L1.

Because the enable signal EN is activated in power-up operation, the NAND gate ND3 receives a high level of signals, i.e., the enable signal EN and the output of the latch L1, and outputs a low level signal. Accordingly, the initial signal Init becomes a high level by the inverter IV19.

The enable signal generators 120 and 220 are activated if the power-up signal Pwrup becomes a high level, and maintain a high level of output for delay time of the delay unit D1. Thereafter, the enable signal generators 120 and 220 repeatedly operate to maintain a low level of output for an identical delay time. The delay time is appropriately determined to confirm operation of the detector according to fluctuation of the back bias voltage VBB or the pumping voltage VPP. In the shift register SR, the transmission gate T1 turns on when the detecting signal DET becomes a high level. The initial signal Init is latched and maintained as a high level. The transmission gate T1 turns off and the transmission gate T2 turns on when the detecting signal DET becomes a low level. The initial signal Init is output as the count signal T.

Each shift register, outputting an input signal based on one period of the detecting signal DET, is connected in series as shown in FIG. 7. The initial signal Init is counted and output as the count signals T0 to T(n−1) according to the enable number of the detecting signal DET. When the enable signal EN becomes a low level, the shift register SR is reset and all count signals T0 to T(n−1) become a low level.

The count signals T0 to T(n−1) are output from the shift register units 130 and 230 to the decoder and latch units 140 and 240. The count signals T0 to T(n−1) are decoded and latched. When only the count signal T0 becomes a high level, the pumping control signal PP1 is output to a high level through the NAND latches L2 to L5. When the count signals T0 and T1 become a high level, the pumping control signal PP2 is output to a high level through the NAND latches L2 to L5.

The NAND latches L2 to L5 latch the preceding value, i.e., the predetermined period of the oscillator, if the enable signal EN becomes a low level. And the NAND latches L2 to L5 latch input signal if the enable signal EN becomes a high level.

Thereafter, the plural pumping control signals PP1 to PP4 are output from the decoder and latch units 140 and 240 to gates of the PMOS transistors P14 to P17 in the pumping voltage oscillators 150 and 250.

The pumping voltage oscillators 150 and 250 are ring oscillators. The pumping voltage oscillators have a low capacitance when the pumping control signal PP is input to a high level, and have a high capacitance when the pumping control signal PP is input to a low level.

If the coupling is increased by the pumping voltage VPP as shown in FIG. 12, the pumping control signals PP1 to PP3 are input to a high level. The capacitance is decreased and a period of the ring oscillating signal is shortened. Accordingly, pumping counts for the back bias voltage VBB are increased and depressing for the back bias voltage is accelerated.

In contrast, if the coupling through the pumping voltage VPP is decreased as shown in FIG. 13, only the pumping control signal PP1 is input to a high level. The capacitance is increased and the period of the ring oscillating signal is lengthened. Accordingly, pumping counts for the back bias voltage VBB are decreased and the back bias voltage is generated stably relative to FIG. 12.

Figure 14:
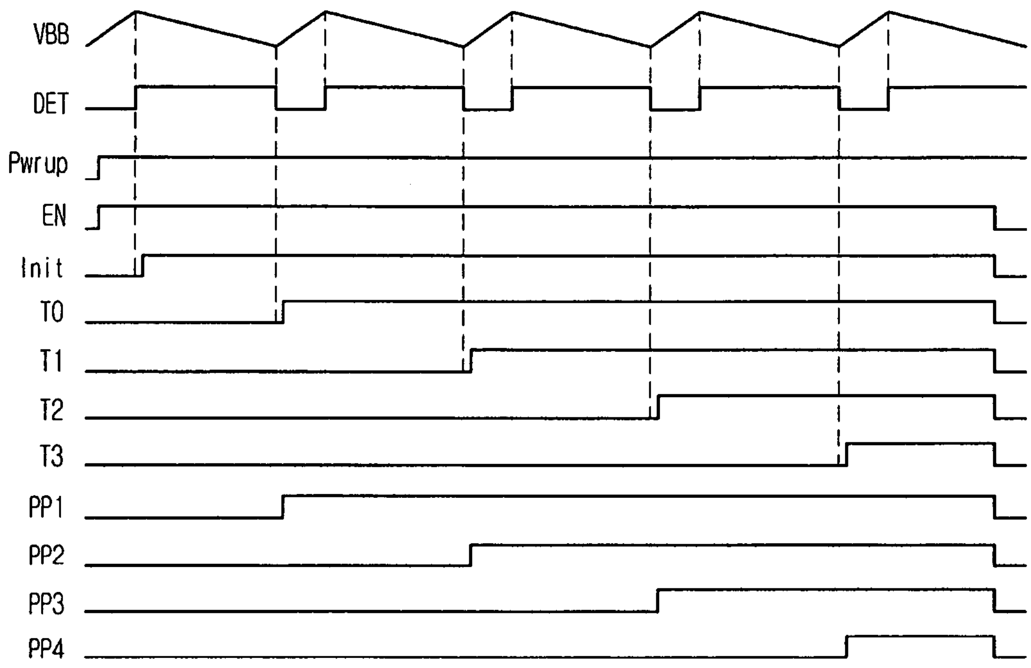

When consumption of pumping currents IPP is increased as shown in FIG. 14, the pumping control signals PP1 to PP3 are input to a high level. The capacitance is decreased and the period of the ring oscillating signal is shortened. Accordingly, pumping counts for the pumping voltage VPP are increased and pressing for the pumping voltage is accelerated.

Figure 15:
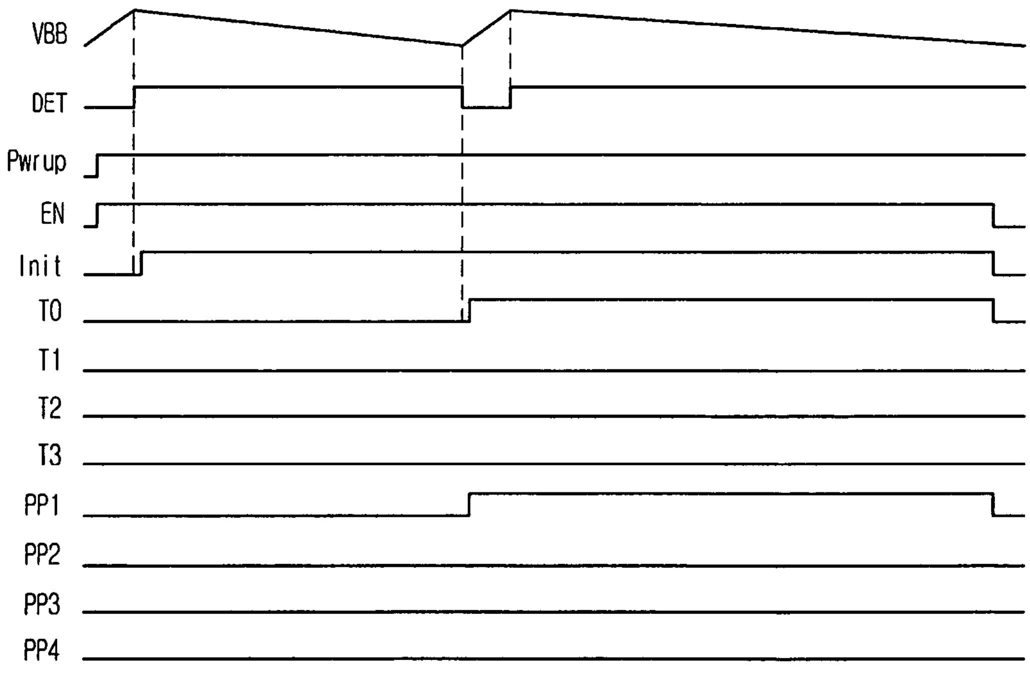

In contrast, if consumption of the pumping currents IPP is decreased as shown in FIG. 15, only the pumping control signal PP1 is input to a high level. The capacitance is increased and the period of the ring oscillating signal is lengthened. Accordingly, pumping counts for the pumping voltage VPP are decreased and the consumption of the pumping currents IPP is decreased.

The present invention is efficient to generate the back bias voltage. When the coupling through the pumping operation is increased, the period of the oscillating signal is controlled to be short. Depressing for the back bias voltage is accelerated. When the coupling through the pumping operation is decreased, the period of the oscillating signal is controlled to be long. Accordingly, the back bias voltage is generated stably.

Further, the present invention is efficient to generate the pumping voltage VPP. When the pumping currents IPP are high, the period of the oscillating signal is controlled to be short. The pressing for the pumping voltage is accelerated. When the pumping currents IPP are small, the period of the oscillating signal is controlled to be long. Accordingly, the pumping voltage is generated stably.

The present application contains subject matter related to Korean patent application No. 2005-90967 and 2006-29647, filed in the Korean Patent Office on Sep. 29, 2005 and Mar. 31, 2006, respectively, the entire contents of which are incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An internal voltage generating circuit, comprising:

a back bias voltage detector for detecting a level difference between a back bias voltage and a reference voltage;

a period controller for controlling a period of an oscillating signal based on a detecting signal of the back bias voltage detector; and a pumping unit for pumping the back bias voltage according to an activation period of the oscillating signal, wherein the period controller includes:

an initial signal generator for generating an initial signal in response to the detecting signal, a power-up signal and an enable signal;

an enable signal generator for generating the enable signal having a delay time controlled by the power-up signal;

a shift register unit for counting the initial signal according to the detecting signal in activation condition of the enable signal and outputting plural count signals;

a decoder and latch unit for decoding and latching the plural count signals and outputting plural pumping control signals; and a pumping voltage oscillator for controlling capacitance according to conditions of the plural pumping control signals and outputting the oscillating signal having different periods.

2. The internal voltage generating circuit as recited in claim 1, wherein the back bias voltage detector outputs a first level of the detecting signal when the back bias voltage is lower than the reference voltage and outputs a second level of the detecting signal when the back bias voltage is higher than the reference voltage.

3. The internal voltage generating circuit as recited in claim 2, wherein the period controller controls the period of the oscillating signal to be short according to the first level of the detecting signal and to be long according to the second level of the detecting signal.

4. The internal voltage generating circuit as recited in claim 1, wherein the initial signal generator performs a logic operation to a high level signal latched and the enable signal, and activates the initial signal, when the power-up signal is activated and the detecting signal becomes a low level.

5. The internal voltage generating circuit as recited in claim 4, wherein the initial signal generator includes:

a first driver for generating the high level signal in response to the low level of the detecting signal in activation condition of the power-up signal;

a first latch for latching an output of the first driver; and a first logic element for performing a logic operation to an output of the first latch and the enable signal and outputting the initial signal.

6. The internal voltage generating circuit as recited in claim 5, wherein the first driver includes:

a first PMOS transistor, connected between a core voltage and a first node, for receiving a ground voltage at a gate; and first and second NMOS transistors, connected in series between the first node and the ground voltage, for receiving an inverse detecting signal or the power-up signal at a corresponding gate.

7. The internal voltage generating circuit as recited in claim 5, wherein the first logic element includes:

a first NAND gate for performing a logic NAND operation to the output of the first latch and the enable signal; and a first inverter for inverting an output of the first NAND gate and outputting the initial signal.

8. The internal voltage generating circuit as recited in claim 1, wherein the enable signal generator includes:

a delay unit for delaying the enable signal for a predetermined delay time: and a first logic element for performing a logic operation to an output of the delay unit and the power-up signal, and outputting the enable signal.

9. The internal voltage generating circuit as recited in claim 8, wherein the first logic element includes a first NAND gate.

10. The internal voltage generating circuit as recited in claim 1, wherein the shift register unit counts the initial signal by the number of the detecting signal, and outputs the plural count signals.

11. The internal voltage generating circuit as recited in claim 1, wherein the shift register unit includes plural shift registers connected in series for receiving the detecting signal and the enable signal and outputting the plural count signals in order, by counting the initial signal.

12. The internal voltage generating circuit as recited in claim 11, wherein each of the plural shift registers latches the initial signal as a high level in activation condition of the detecting signal and outputs the latched signal as the count signal in inactivation condition of the detecting signal.

13. The internal voltage generating circuit as recited in claim 12, wherein each of the plural shift registers includes:

a first transmission gate for selectively outputting the initial signal according to conditions of the detecting signal;

a first latch for latching an output of the first transmission gate in response to the enable signal;

a first inverter for inverting an output of the first latch;

a second transmission gate for selectively outputting an output of the first inverter according to conditions of the detecting signal;

a second latch for latching an output of the second transmission gate in response to the enable signal; and a second inverter for inverting an output of the second latch and outputting the corresponding count signal.

14. The internal voltage generating circuit as recited in claim 13, wherein the first and second latches are NAND latches.

15. The internal voltage generating circuit as recited in claim 13, wherein the first and the second transmission gates operate complementary.

16. The internal voltage generating circuit as recited in claim 1, wherein the shift register unit is reset and outputs the plural count signals as a low level in synchronization with inactivation of the enable signal.

17. The internal voltage generating circuit as recited in claim 1, wherein the decoder and latch unit includes:

a decoder for decoding the plural count signals; and a latch unit for latching an output of the decoder according to the enable signal and outputting the plural pumping control signals.

18. The internal voltage generating circuit as recited in claim 17, wherein the latch unit includes plural NAND latches corresponding to the plural pumping control signals.

19. The internal voltage generating circuit as recited in claim 18, wherein each of the plural NAND latches latches a predetermined value in inactivation condition of the enable signal and latches its corresponding input signal in activation condition of the enable signal.

20. The internal voltage generating circuit as recited in claim 1, wherein the decoder and latch unit activates and outputs a first pumping control signal of the plural pumping control signals in activation of a first count signal of the plural count signals, and activates and outputs the others plural pumping control signals in activation of the other plural count signals.

21. The internal voltage generating circuit as recited in claim 1, wherein the pumping voltage oscillator includes a ring oscillator.

22. The internal voltage generating circuit as recited in claim 21, wherein the pumping voltage oscillator has a low capacitance and shortens the period of the oscillating signal when the plural pumping control signals are input as a high level, and has a high capacitance and lengthens the period of the oscillating signal when the plural pumping control signals are input as a low level.

23. An internal voltage generating circuit, comprising:

a pumping voltage detector for detecting a level difference between a pumping voltage and a reference voltage;

a period controller for counting timing when the pumping voltage is lower than the reference voltage to generate an oscillating signal having a period determined by a counted value; and a pumping unit for pumping the pumping voltage according to an activation period of the oscillating signal, wherein the period controller includes:

an initial signal generator for generating an initial signal in response to a detecting signal, from the pumping voltage detector a power-up signal and an enable signal;

an enable signal generator for generating the enable signal having a delay time controlled by the power-up signal;

a shift register unit for counting the initial signal according to the detecting signal in activation condition of the enable signal and outputting plural count signals;

a decoder and latch unit for decoding and latching the plural count signals and outputting plural pumping control signals; and a pumping voltage oscillator for controlling capacitance according to conditions of the plural pumping control signals and outputting the oscillating signal having different periods.

24. The internal voltage generating circuit as recited in claim 23, wherein the pumping voltage detector outputs a first level of the detecting signal if the pumping voltage is lower than the reference voltage and outputs a second level of the detecting signal if the pumping voltage is higher than the reference voltage.

25. The internal voltage generating circuit as recited in claim 24, wherein the period controller controls the period of the oscillating signal to be short according to the first level of the detecting signal and to be long according to the second level of the detecting signal.

26. The internal voltage generating circuit as recited in claim 23, wherein the initial signal generator performs a logic operation to a high level signal latched and the enable signal, and activates the initial signal when the power-up signal is activated and the detecting signal becomes a low level.

27. The internal voltage generating circuit as recited in claim 26, wherein the initial signal generator includes:

a first driver for generating the high level signal in response to the low level of the detecting signal in activation condition of the power-up signal;

a first latch for latching an output of the first driver; and a first logic element for performing a logic operation to an output of the first latch and the enable signal and outputting the initial signal.

28. The internal voltage generating circuit as recited in claim 27, wherein the first driver includes:

a first PMOS transistor, connected between a core voltage and a first node, for receiving a ground voltage at a gate; and first and second NMOS transistors, connected in series between the first node and the ground voltage, for receiving an inverse detecting signal or the power-up signal at a corresponding gate.

29. The internal voltage generating circuit as recited in claim 27, wherein the first logic element includes:

a first NAND gate for performing a logic NAND operation to the output of the first latch and the enable signal; and a first inverter for inverting an output of the first NAND gate and outputting the initial signal.

30. The internal voltage generating circuit as recited in claim 23, wherein the enable signal generator includes:

a delay unit for delaying the enable signal for a predetermined delay time: and a first logic element for performing a logic operation to an output of the delay unit and the power-up signal, and outputting the enable signal.

31. The internal voltage generating circuit as recited in claim 30, wherein the first logic element includes a first NAND gate.

32. The internal voltage generating circuit as recited in claim 23, wherein the shift register unit counts the initial signal by the number of the detecting signal, and outputs the plural count signals.

33. The internal voltage generating circuit as recited in claim 23, wherein the shift register unit includes plural shift registers connected in series for receiving the detecting signal and the enable signal and outputting the plural count signals in order, by counting the initial signal.

34. The internal voltage generating circuit as recited in claim 33, wherein each of the plural shift registers latches the initial signal as a high level in activation condition of the detecting signal and outputs the latched signal as the count signal in inactivation condition of the detecting signal.

35. The internal voltage generating circuit as recited in claim 34, wherein each of the plural shift registers includes:

a first transmission gate for selectively outputting the initial signal according to conditions of the detecting signal;

a first latch for latching an output of the first transmission gate in response to the enable signal;

a first inverter for inverting an output of the first latch;

a second transmission gate for selectively outputting an output of the first inverter according to conditions of the detecting signal;

a second latch for latching an output of the second transmission gate in response to the enable signal; and second inverter for inverting an output of the second latch and outputting the corresponding count signal.

36. The internal voltage generating circuit as recited in claim 35, wherein the first and second latches are NAND latches.

37. The internal voltage generating circuit as recited in claim 35, wherein the first and the second transmission gates operate complementary.

38. The internal voltage generating circuit as recited in claim 35, wherein the shift register unit is reset and outputs the plural count signals as a low level in synchronization with inactivation of the enable signal.

39. The internal voltage generating circuit as recited in claim 23, wherein the decoder and latch unit includes:

a decoder for decoding the plural count signals; and a latch unit for latching an output of the decoder according to the enable signal and outputting the plural pumping control signals.

40. The internal voltage generating circuit as recited in claim 39, wherein the latch unit includes plural NAND latches corresponding to the plural pumping control signals.

41. The internal voltage generating circuit as recited in claim 40, wherein each of the plural NAND latches latches a predetermined value in inactivation condition of the enable signal and latches its corresponding input signal in activation condition of the enable signal.

42. The internal voltage generating circuit as recited in claim 23, wherein the decoder and latch unit activates and outputs a first pumping control signal of the plural pumping control signals in activation of a first count signal of the plural count signals, and activates and outputs the other plural pumping control signals in activation of the other plural count signals.

43. The internal voltage generating circuit as recited in claim 23, wherein the pumping voltage oscillator includes a ring oscillator.

44. The internal voltage generating circuit as recited in claim 43, wherein the pumping voltage oscillator has a low capacitance and shortens the period of the oscillating signal when the plural pumping control signals are input as a high level, and has a high capacitance and lengthens the period of the oscillating signal when the plural pumping control signals are input as a low level.

* * * * *